US011637032B2

(12) United States Patent
Hattori

(10) Patent No.: US 11,637,032 B2
(45) Date of Patent: Apr. 25, 2023

(54) TAPE EXPANDING APPARATUS

(71) Applicant: DISCO CORPORATION, Tokyo (JP)

(72) Inventor: Atsushi Hattori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 953 days.

(21) Appl. No.: 16/445,578

(22) Filed: Jun. 19, 2019

(65) Prior Publication Data

US 2019/0385888 A1    Dec. 19, 2019

(30) Foreign Application Priority Data

Jun. 19, 2018   (JP) .............................. JP2018-116261

(51) Int. Cl.
```
H01L 21/683       (2006.01)
H01L 21/67        (2006.01)
H05K 13/04        (2006.01)
```

(52) U.S. Cl.
CPC .... *H01L 21/6836* (2013.01); *H01L 21/67092* (2013.01); *H01L 21/67109* (2013.01); *H01L 21/67259* (2013.01); *H05K 13/04* (2013.01); *H01L 2221/68336* (2013.01)

(58) Field of Classification Search
CPC .................................................. H01L 21/6836
See application file for complete search history.

(56) References Cited

U.S. PATENT DOCUMENTS

| | | | | |
|---|---|---|---|---|
| 2004/0266094 | A1* | 12/2004 | Nagai | ............... H01L 21/67092 |
| | | | | 438/232 |
| 2006/0035444 | A1* | 2/2006 | Nakamura | ........... H01L 21/6836 |
| | | | | 438/464 |
| 2017/0330799 | A1* | 11/2017 | Sekiya | .............. H01L 21/02016 |
| 2017/0358465 | A1* | 12/2017 | Togashi | ............ H01L 21/67282 |

FOREIGN PATENT DOCUMENTS

| | | |
|---|---|---|
| JP | 2002192370 A | 7/2002 |
| JP | 2010034250 A | 2/2010 |
| JP | 2010206136 A | 9/2010 |
| JP | 2011077482 A | 4/2011 |
| JP | 2018067668 A | 4/2018 |

* cited by examiner

*Primary Examiner* — William A Harriston
(74) *Attorney, Agent, or Firm* — Greer, Burns & Crain, Ltd.

(57) ABSTRACT

A tape expanding apparatus for expanding an expandable tape of a frame unit in which a workpiece is supported through the expandable tape to an annular frame includes a frame holding unit for holding the annular frame, a chuck table surrounded by the frame holding unit and having a holding surface for holding the workpiece through the expandable tape, and a position adjusting unit for adjusting a position of the workpiece with respect to the holding surface. The position adjusting unit includes a position detecting unit for detecting the position of the workpiece held on the holding surface and a position control unit having an abutting unit adapted to abut against an outer circumference of the annular frame supported by the frame holding unit and a moving mechanism for moving the abutting unit according to the position of the workpiece detected by the position detecting unit.

12 Claims, 5 Drawing Sheets

TAPE EXPANDING APPARATUS

BACKGROUND OF THE INVENTION

Field of the Invention

The present invention relates to a tape expanding apparatus for expanding an expandable tape attached to a workpiece such as a semiconductor wafer.

Description of the Related Art

A plurality of devices such as integrated circuits (ICs) and large-scale integrated circuits (LSIs) are formed on a plate-shaped workpiece typified by a semiconductor wafer so as to be separated from each other by a plurality of division lines (streets). The workpiece thus having the plurality of devices is divided along the division lines to thereby obtain a plurality of device chips individually including the plurality of devices. For example, the workpiece is divided by using a cutting apparatus having an annular cutting blade, in which the workpiece is cut along each division line by the cutting blade. There has been proposed another method using a laser beam to divide the workpiece as disclosed in Japanese Patent Laid-open No. 2002-192370, for example. In this method, a laser beam is applied to the workpiece to thereby form a modified layer (modified area) inside the workpiece. Thereafter, an external force is applied to the workpiece to thereby break the workpiece at the modified layer as a division start point. The application of the external force to the workpiece in which the modified layer is formed may be realized by expanding an expandable tape attached to the workpiece. For example, Japanese Patent Laid-open No. 2010-206136 discloses a work dividing apparatus for forming a modified layer inside a workpiece attached to a circular expandable tape and next expanding the expandable tape to thereby apply an external force to the workpiece, thereby dividing the workpiece into a plurality of device chips.

SUMMARY OF THE INVENTION

In dividing the workpiece by using the work dividing apparatus mentioned above, the workpiece is first attached to a central portion of the expandable tape, and an annular frame is also attached to a peripheral portion of the expandable tape. Accordingly, the workpiece is supported through the expandable tape to the annular frame so as to be surrounded by the annular frame, thereby forming a frame unit composed of the workpiece, the expandable tape, and the annular frame united together. In the condition where the annular frame is fixed, the central portion of the expandable tape is pushed up to apply a tensile force to the expandable tape, thereby expanding the expandable tape. As a result, an external force is applied to the workpiece in a direction of expansion of the expandable tape. The amount of vertical shift of the expandable tape in pushing up the expandable tape is previously set such that the workpiece is properly divided along the division lines, in consideration of various conditions including the size and shape of the workpiece and the number of division lines. The amount of vertical shift of the expandable tape is decided on the precondition that the workpiece is attached to a predetermined position on the expandable tape (e.g., the center of the workpiece coincides with the center of the expandable tape). Accordingly, if the attach position of the workpiece to the expandable tape is deviated, there is a possibility that an intended external force is not applied to the whole of the workpiece, causing improper division of the workpiece.

Further, with a decrease in size of each device chip in recent years, the number of division lines has been increased. When the number of division lines increases, there arises a problem such that a spacing for separating the device chips divided from the workpiece may be less prone to generate in expanding the expandable tape. Further, the amount of expansion of the expandable tape is limited, so that it is difficult to increase the amount of expansion of the expandable tape in accordance with an increase in the number of division lines. That is, the larger the number of division lines, the more difficult the proper division of the workpiece. Accordingly, in the case that the workpiece having a large number of division lines is to be divided and that the attach position of the workpiece to the expandable tape is deviated to cause a possibility that an intended external force cannot be applied to the workpiece, it is increasingly difficult to properly divide the workpiece, so that there is a possibility that many undivided areas (improperly divided areas) may be left in the workpiece. Thusly, in dividing the workpiece having a large number of division lines, the influence of deviation in position of the workpiece upon the division of the workpiece becomes more serious.

It is therefore an object of the present invention to provide a tape expanding apparatus which can properly divide the workpiece even when the workpiece attached to the expandable tape is deviated in position.

In accordance with an aspect of the present invention, there is provided a tape expanding apparatus for expanding an expandable tape of a frame unit in which a workpiece having a plurality of division start points formed along a plurality of division lines is supported through the expandable tape to an annular frame, the tape expanding apparatus including a frame holding unit for holding the annular frame; a chuck table surrounded by the frame holding unit, the chuck table having a holding surface for holding the workpiece through the expandable tape; a moving unit for relatively moving the chuck table and the frame holding unit in a direction perpendicular to the holding surface; a cassette mounting stage for mounting the cassette storing the frame unit; a temporary setting area for temporarily setting the frame unit drawn from the cassette; a transfer unit for transferring the frame unit from the temporary setting area to the chuck table; and a position adjusting unit for adjusting the position of the workpiece with respect to the holding surface; the position adjusting unit including a position detecting unit for detecting the position of the workpiece temporarily set in the temporary setting area or held on the holding surface; and a position control unit having an abutting unit adapted to abut against an outer circumference of the annular frame supported by the frame holding unit and a moving mechanism for moving the abutting unit according to a position of the workpiece detected by the position detecting unit.

Preferably, the position detecting unit is configured by a camera unit for imaging an outer circumference of the workpiece. Preferably, the tape expanding apparatus further includes a heating unit for heating an annular area of the expandable tape defined between the annular frame and the workpiece, thereby shrinking the annular area to thereby remove a slack in the annular area of the expandable tape due to the expansion of the expandable tape. Preferably, the tape expanding apparatus further includes: a cooling chamber in which the frame holding unit and the chuck table are provided; and a cold air supplying unit for supplying a cold air into the cooling chamber, the expandable tape being attached through a die attach film to the workpiece.

As described above, the tape expanding apparatus of the present invention includes the position adjusting unit for detecting the position of the workpiece and then adjusting the position of the frame unit according to the position of the workpiece detected above. Accordingly, the workpiece can be set at a proper position on the chuck table, so that the workpiece can be reliably divided by the expansion of the expandable tape.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
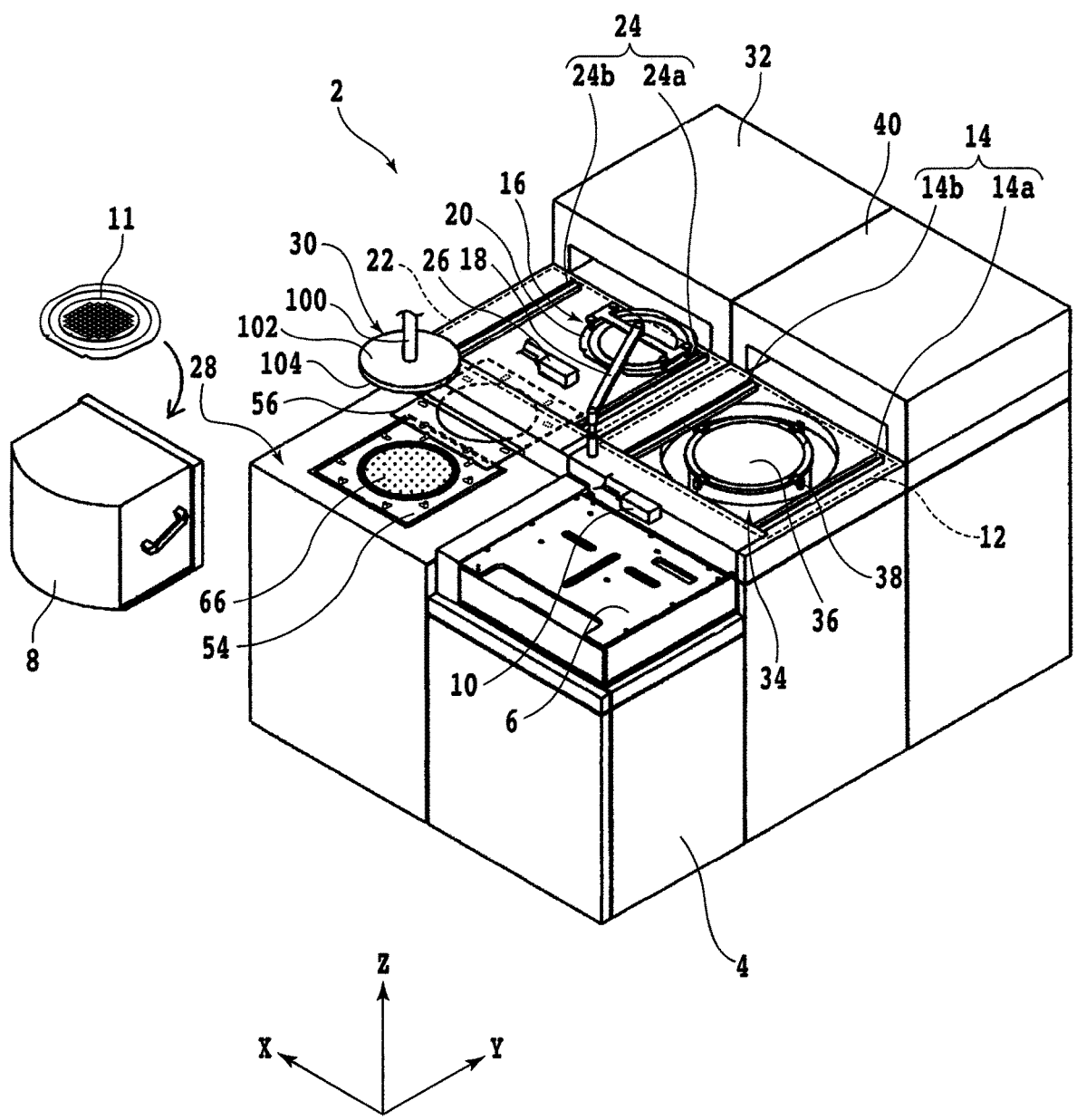
FIG. 1 is a perspective view depicting a tape expanding apparatus according to a preferred embodiment of the present invention.
Figure 2A:
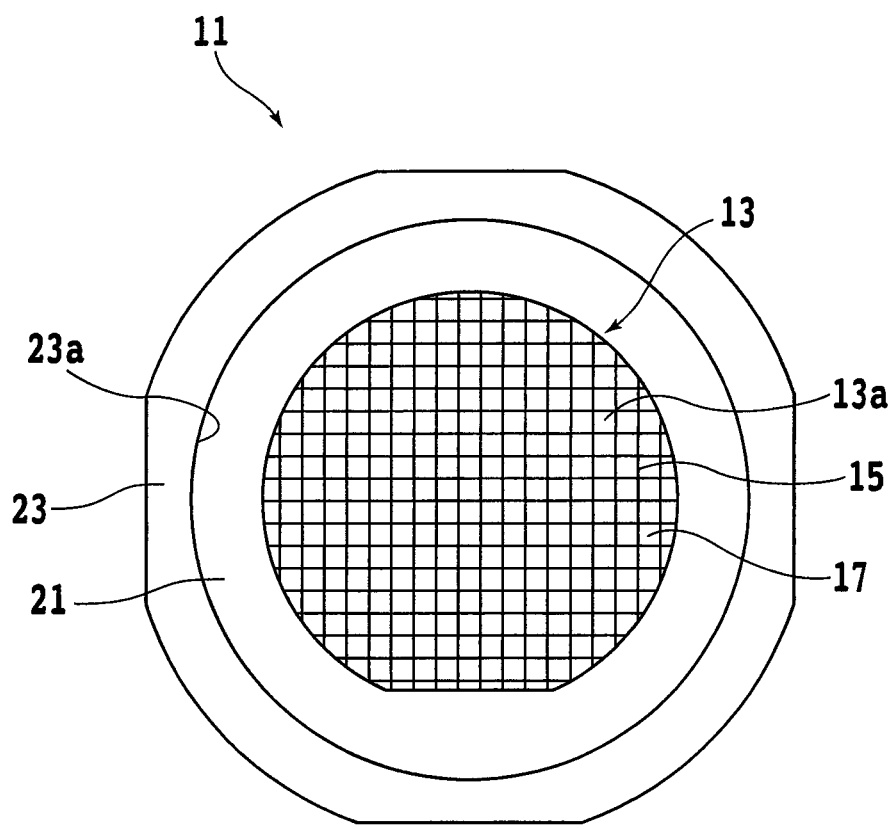
FIG. 2A is a plan view depicting a frame unit to be processed in the tape expanding apparatus depicted in FIG. 1.
Figure 2B:
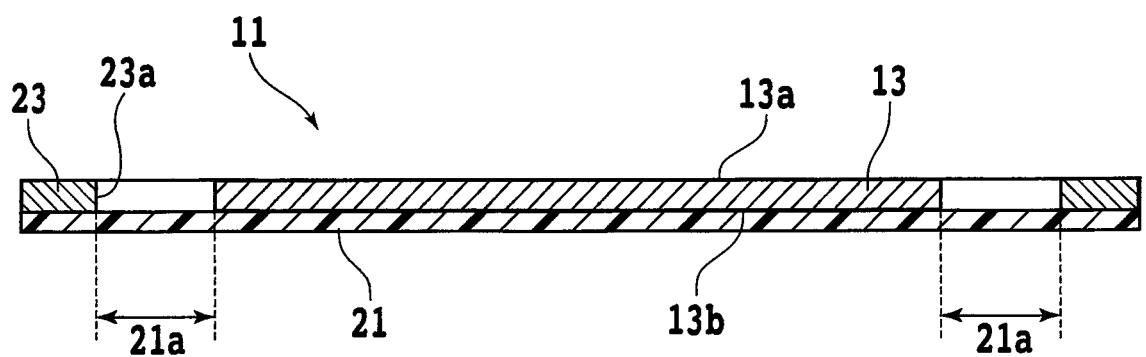
FIG. 2B is a sectional view of the frame unit depicted in FIG. 2A.

A preferred embodiment of the present invention will now be described with reference to the attached drawings. This preferred embodiment relates to a tape expanding apparatus for expanding an expandable tape attached to a plate-shaped workpiece typified by a semiconductor wafer. The configuration of a tape expanding apparatus 2 according to this preferred embodiment will now be described with reference to FIG. 1. FIG. 1 is a perspective view of the tape expanding apparatus 2 according to this preferred embodiment. As depicted in FIG. 1, the tape expanding apparatus 2 includes a base housing 4 on which various components of the tape expanding apparatus 2 are mounted. A cassette mounting stage 6 for mounting a cassette 8 thereon is provided on an upper surface of the base housing 4 at its front portion. The cassette mounting stage 6 is movable in a vertical direction (Z direction indicated by an arrow Z in FIG. 1). The cassette 8 is so configured as to store a plurality of frame units 11, in which each frame unit 11 includes a plate-shaped workpiece supported by an annular frame through an expandable tape to be hereinafter described. The configuration of each frame unit 11 stored in the cassette 8 will be described with reference to FIGS. 2A and 2B. FIG. 2A is a plan view of each frame unit 11, and FIG. 2B is a sectional view of the frame unit 11 depicted in FIG. 2A. As depicted in FIGS. 2A and 2B, the frame unit 11 is composed of a circular workpiece 13, a circular expandable tape 21, and an annular frame 23, in which the workpiece 13 is supported through the expandable tape 21 to the annular frame 23 so as to be surrounded by the annular frame 23.

The workpiece 13 is a disk-shaped wafer formed of silicon, for example. The workpiece 13 has a front side 13a and a back side 13b. A plurality of crossing division lines (streets) 15 are set on the front side 13a of the workpiece 13 to thereby define a plurality of separate regions where a plurality of devices 17 such as integrated circuits (ICs) and large-scale integrated circuits (LSIs) are individually formed. By dividing the workpiece 13 along the division lines 15, a plurality of device chips individually including the plurality of devices 17 are obtained. While the workpiece 13 is a disk-shaped wafer formed of silicon in this preferred embodiment, the workpiece 13 is not limited in material, shape, structure, and size, for example. For example, the workpiece 13 may be a wafer formed of any semiconductors other than silicon, such as gallium arsenide (GaAs), indium phosphide (InP), gallium nitride (GaN), and silicon carbide (SiC). Further, the workpiece 13 may be a wafer formed of any other materials such as glass, ceramic, resin (plastic), and metal. Further, the devices 17 are not limited in kind, number, shape, structure, size, and layout, for example.

As depicted in FIG. 2B, the circular expandable tape 21 is larger in diameter than the circular workpiece 13, and the back side 13b of the workpiece 13 is attached to a central portion of the expandable tape 21. Further, the annular frame 23 has a circular central opening 23a, and a peripheral portion of the expandable tape 21 is attached to the lower surface of the annular frame 23. Accordingly, the workpiece 13 is supported through the expandable tape 21 to the annular frame 23 so as to be surrounded by the annular frame 23. The expandable tape 21 is an adhesive tape expandable by applying an external force thereto. For example, the expandable tape 21 is composed of a base sheet and an adhesive layer formed on one side of the base sheet, in which the base sheet has expandability at room temperature and also has a property of shrinking when heated to a predetermined temperature (e.g., 70° C.) or higher. For example, the base sheet is formed of synthetic resin such as polyvinyl chloride, polypropylene, polyethylene, and any other polyolefins. Further, the adhesive layer may be formed of UV curable resin that can be cured by applying ultraviolet light thereto.

A division start point is previously formed along each division line 15 of the workpiece 13. The division start point is an area brittler than the other area in the workpiece 13 and functions as a trigger such that the workpiece 13 starts to be divided when an external force is applied to the workpiece 13 in the subsequent step. The division start point may be linearly formed along each division line 15 or may be dotted along each division line 15. For example, the division start point may be formed by applying a laser beam to the workpiece 13. More specifically, a laser beam having a transmission wavelength to the workpiece 13 is applied to the workpiece 13 so as to be focused inside the workpiece 13, thereby forming a modified layer inside the workpiece 13, in which the modified layer is an area reduced in strength. When an external force is applied to the workpiece 13 along each division line 15 where the modified layer is formed, the workpiece 13 starts to be broken from the modified layer as the division start point, so that the workpiece 13 is divided along each division line 15. As another method, the division start point may be formed by cutting the workpiece 13 along each division line 15. In this method, the workpiece 13 may be cut by using a cutting apparatus including a chuck table for holding the workpiece 13 and a spindle having an annular cutting blade for cutting the workpiece 13. More specifically, the cutting blade is rotated in the condition where the workpiece 13 is held on the chuck table, and the cutting blade is next moved to cut the front side 13a of the workpiece 13 along each division line 15, thereby forming a straight groove along each division line 15. This groove functions as the division start point in dividing the workpiece 13. In the condition where the workpiece 13 having the division start point previously formed is attached to the expandable tape 21, the expandable tape 21 is expanded by applying an external force, so that the workpiece 13 can be divided along each division line 15 where the division start point is formed.

As described above, a plurality of frame units 11 are stored in the cassette 8, and the cassette 8 is placed on the cassette mounting stage 6 depicted in FIG. 1. A first transfer unit 10 for transferring each frame unit 11 is provided in the vicinity of the cassette mounting stage 6. Each frame unit 11 stored in the cassette 8 is drawn from the cassette 8 by the first transfer unit 10. For example, the first transfer unit 10 has a clamp (not depicted) for holding the annular frame 23 of the frame unit 11. In the condition where the frame unit 11 is held by the clamp of the first transfer unit 10, the first transfer unit 10 is moved in the Y direction indicated by an arrow Y in FIG. 1 to thereby transfer the frame unit 11.

A first temporary setting area 12 for temporarily setting the frame unit 11 is defined behind the cassette mounting stage 6, that is, on the rear side of the cassette mounting stage 6 in the Y direction. There is provided in the first temporary setting area 12 a first temporary setting unit 14 for positioning the frame unit 11. The first temporary setting unit 14 is configured by a pair of first guide rails 14a and 14b extending in parallel to each other in the Y direction. The first guide rails 14a and 14b are adapted to be moved toward and away from each other in the X direction indicated by an arrow X in FIG. 1. Each of the first guide rails 14a and 14b has an L-shaped cross section. That is, each of the first guide rails 14a and 14b has a horizontal surface for supporting the frame unit 11 and a vertical surface projecting upright from this horizontal surface and adapted to come into contact with the outer circumference of the frame unit 11. The frame unit 11 drawn from the cassette 8 by the first transfer unit 10 is transferred to the first guide rails 14a and 14b, and then supported on the horizontal surfaces of the first guide rails 14a and 14b. Thereafter, the first guide rails 14a and 14b are moved toward each other in the X direction, so that the vertical surfaces of the first guide rails 14a and 14b come into abutment against the outer circumference of the frame unit 11. That is, the frame unit 11 is diametrically held by the vertical surfaces of the first guide rails 14a and 14b. Thus, the frame unit 11 is positioned by the first guide rails 14a and 14b in the first temporary setting area 12.

A second transfer unit 16 for transferring the frame unit 11 is provided in the vicinity of the first temporary setting area 12. The second transfer unit 16 includes an arm 18 vertically movable and horizontally rotatable and a suction pad 20 mounted at the front end of the arm 18 for holding the frame unit 11 under suction. The frame unit 11 is adapted to be held by the suction pad 20. In the condition where the frame unit 11 is held by the suction pad 20 under suction, the arm 18 is horizontally rotated about its base end (vertical axis) to thereby transfer the frame unit 11 to a predetermined position.

A second temporary setting area 22 for temporarily setting the frame unit 11 is defined adjacent to the first temporary setting area 12 in the X direction. There is provided in the second temporary setting area 22 a second temporary setting unit 24 for positioning the frame unit 11. The second temporary setting unit 24 is configured by a pair of second guide rails 24a and 24b. The second guide rails 24a and 24b are similar to the first guide rails 14a and 14b in configuration and function. The frame unit 11 placed on the first guide rails 14a and 14b are transferred to the second guide rails 24a and 24b by the second transfer unit 16 and then supported on horizontal surfaces of the second guide rails 24a and 24b. Thereafter, the second guide rails 24a and 24b are moved toward each other in the X direction, so that vertical surfaces of the second guide rails 24a and 24b come into abutment against the outer circumference of the frame unit 11. Thus, the frame unit 11 is positioned by the second guide rails 24a and 24b in the second temporary setting area 22.

A third transfer unit 26 for transferring the frame unit 11 is provided in the vicinity of the second temporary setting area 22. For example, the third transfer unit 26 has a clamp (not depicted) for holding the annular frame 23 of the frame unit 11. In the condition where the frame unit 11 is held by the clamp of the third transfer unit 26, the third transfer unit 26 is moved in the Y direction to thereby transfer the frame unit 11. A tape expanding unit 28 for expanding the expandable tape 21 (see FIGS. 2A and 2B) attached to the workpiece 13 is located before the second temporary setting area 22, that is, on the front side of the second temporary setting area 22 in the Y direction. The frame unit 11 placed on the second guide rails 24a and 24b is transferred to the tape expanding unit 28 by the third transfer unit 26. Thereafter, the expandable tape 21 attached to the workpiece 13 is expanded by the tape expanding unit 28. Accordingly, the workpiece 13 receives an external force applied to the expandable tape 21 in a tape expansion direction, so that the workpiece 13 is divided along each division line 15 where the division start point is formed.

Figure 3:
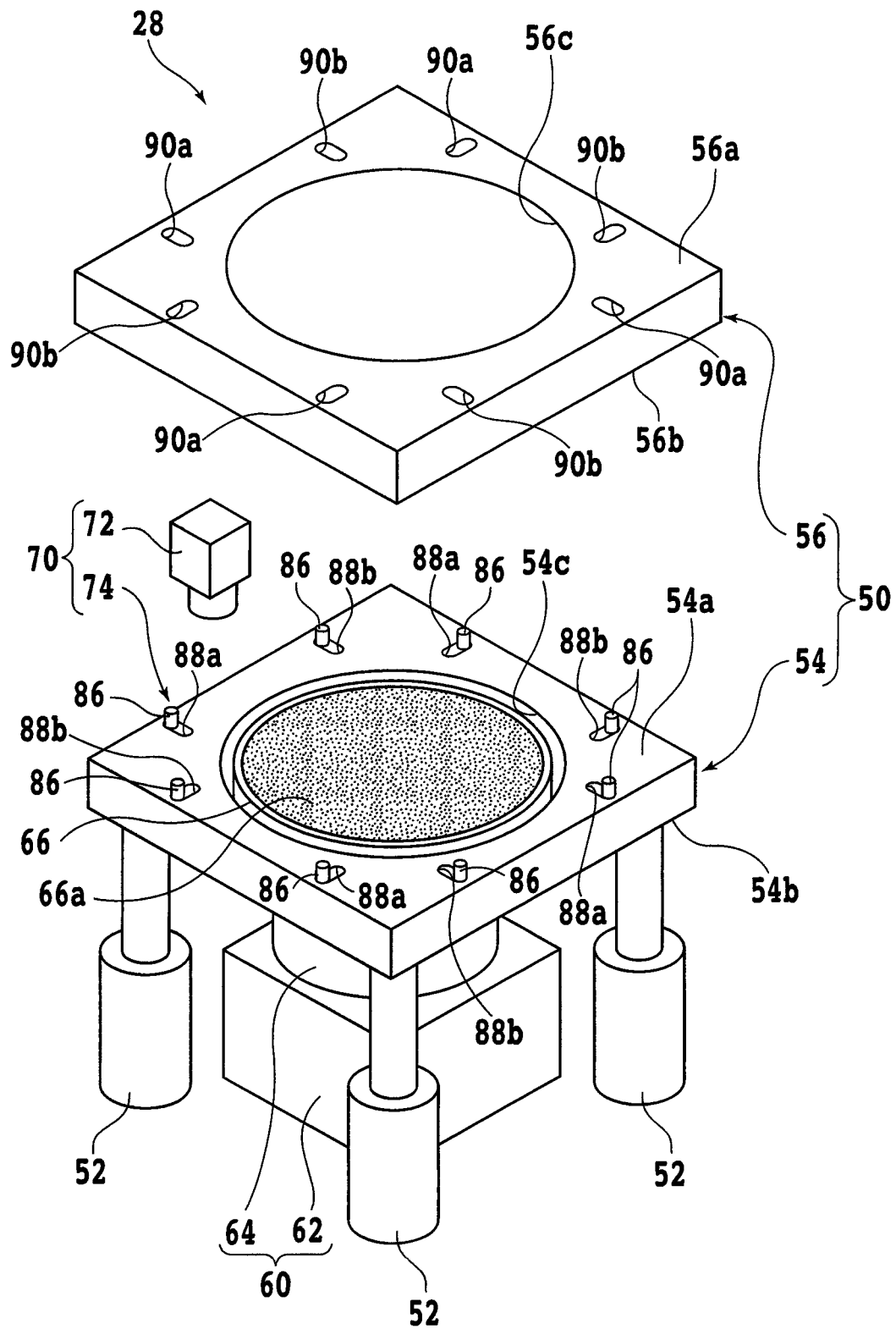
FIG. 3 is a perspective view depicting a tape expanding unit included in the tape expanding apparatus depicted in FIG. 1.

The configuration of the tape expanding unit 28 will now be described with reference to FIG. 3. FIG. 3 is a perspective view of the tape expanding unit 28. The tape expanding unit 28 includes four cylindrical support structures 52, and a support table 54 for supporting the annular frame 23 of the frame unit 11 is fixed to the upper ends of these four support structures 52. Each support structure 52 is so configured as to have a piston rod, for example, and has a function of vertically moving the support table 54.

The support table 54 has an upper surface 54a and a lower surface 54b. The support table 54 is square as viewed in plan. The support table 54 has a central circular opening 54c as a through hole extending from the upper surface 54a to the lower surface 54b. The shape of the opening 54c of the support table 54 corresponds to the shape of the opening 23a of the annular frame 23 (see FIGS. 2A and 2B) supporting the workpiece 13. For example, the diameter of the opening 54c of the support table 54 is substantially equal to the diameter of the opening 23a of the annular frame 23. A fixing plate 56 for fixing the annular frame 23 supported by the support table 54 from above is provided above the support table 54. The fixing plate 56 is also square as viewed in plan. The fixing plate 56 has an upper surface 56a and a lower surface 56b. The fixing plate 56 has a central circular opening 56c as a through hole extending from the upper surface 56a to the lower surface 56b. The shape of the opening 56c of the fixing plate 56 corresponds to the shape of the opening 54c of the support table 54. For example, the diameter of the opening 56c of the fixing plate 56 is substantially equal to the diameter of the opening 54c of the support table 54. The frame unit 11 is adapted to be set on the support table 54 in such a manner that the annular frame 23 comes into contact with the upper surface 54a of the support table 54. In this condition, the annular frame 23 of the frame unit 11 is supported by the support table 54. In this condition, the support table 54 and the fixing plate 56 are relatively moved in the vertical direction, so that the fixing plate 56 is positioned so as to cover the upper surface 54a of the support table 54. Accordingly, the annular frame 23 can be held between the support table 54 and the fixing plate 56. That is, the support table 54 and the fixing plate 56 constitute a frame holding unit 50 for holding the annular frame 23 of the frame unit 11, that is, fixing the annular frame 23 in position. The fixing plate 56 is normally stored in a lower space (not depicted) defined below the second temporary setting area 22 (see FIG. 1). That is, when holding the frame unit 11 by using the frame holding unit 50, the fixing plate 56 is moved out of this lower space defined below the second temporary setting area 22 and then positioned directly above the support table 54. The workpiece 13 of the frame unit 11 is positioned so as to be aligned with the opening 54c of the support table 54 and the opening 56c of the fixing plate 56. Accordingly, in the condition where the annular frame 23 is held by the frame holding unit 50, the workpiece 13 is separate from the support table 54 and the fixing plate 56. In other words, the workpiece 13 is positioned so as to be surrounded by the support table 54 and the fixing plate 56.

A moving unit 60 is provided inside the frame support structures 52. The moving unit 60 includes a cylinder case 62 and a piston rod 64 having a lower end inserted in the cylinder case 62. The piston rod 64 is supported to the cylinder case 62 so as to be vertically movable. The piston rod 64 has an upper end connected to a disk-shaped chuck table 66 for holding the workpiece 13 of the frame unit 11 (see FIGS. 2A and 2B). That is, the chuck table 66 is fixed to the upper end of the piston rod 64. The chuck table 66 has an upper surface as a holding surface 66a for holding the workpiece 13. The holding surface 66a is substantially horizontal and it is connected through a suction passage (not depicted) to a vacuum source (not depicted) such as an ejector, in which the suction passage is formed inside the chuck table 66. The frame unit 11 placed in the second temporary setting area 22 depicted in FIG. 1 is transferred to the tape expanding unit 28 by the third transfer unit 26 in such a manner that the workpiece 13 is placed through the expandable tape 21 on the holding surface 66a of the chuck table 66. The diameter of the chuck table 66 is smaller than the diameter of the opening 54c of the support table 54 and the diameter of the opening 56c of the fixing plate 56. Further, the chuck table 66 is aligned with the opening 54c of the support table 54 and the opening 56c of the fixing plate 56. That is, the chuck table 66 is located so as to be surrounded by the support table 54 and the fixing plate 56. The chuck table 66 is initially positioned such that the holding surface 66a of the chuck table 66 is substantially at the same level as that of the upper surface 54a of the support table 54. At this initial position, the chuck table 66 is surrounded by the frame holding unit 50. When the piston rod 64 of the moving unit 60 is raised in the condition where the annular frame 23 of the frame unit 11 is held between the support table 54 and the fixing plate 56, the chuck table 66 is raised by the piston rod 64 so as to project upward from the upper surface 56a of the fixing plate 56 through the opening 54c and the opening 56c. That is, the frame holding unit 50 and the holding surface 66a of the chuck table 66 are relatively moved away from each other by the moving unit 60 in a direction (vertical direction) perpendicular to the holding surface 66a of the chuck table 66.

Accordingly, the expandable tape 21 of the frame unit 11 is expanded by the tape expanding unit 28, so that the workpiece 13 is divided along each division line 15 where the division start point is formed. The operation of the tape expanding unit 28 will now be described in more detail. First, the frame unit 11 placed in the second temporary setting area 22 (see FIG. 1) is transferred to the tape expanding unit 28 by the third transfer unit 26. More specifically, the frame unit 11 is set in the tape expanding unit 28 in such a manner that the workpiece 13 is supported through the expandable tape 21 on the holding surface 66a of the chuck table 66 and that the annular frame 23 is supported through the expandable tape 21 on the upper surface 54a of the support table 54. As depicted in FIGS. 2A and 2B, an annular area 21a of the expandable tape 21 is defined between the workpiece 13 and the annular frame 23, and at least a part of this annular area 21a is aligned with an annular gap defined between the holding surface 66a of the chuck table 66 and the upper surface 54a of the support table 54.

Thereafter, the fixing plate 56 is set directly above the support table 54, and the support table 54 and the fixing plate 56 are relatively moved toward each other in the vertical direction, thereby pressing the fixing plate 56 against the annular frame 23 placed on the support table 54. As a result, the annular frame 23 is held between the support table 54 and the fixing plate 56. That is, the annular frame 23 is held by the frame holding unit 50. In the condition where the annular frame 23 is held by the frame holding unit 50, the piston rod 64 of the moving unit 60 is raised to thereby raise the chuck table 66. Accordingly, the chuck table 66 is moved so as to project upward from the opening 56c of the fixing plate 56. At this time, an external force is applied to the expandable tape 21 in the radially outward direction thereof, so that the expandable tape 21 is expanded radially outward. Due to this expansion of the expandable tape 21, an external force is applied to the workpiece 13 attached to the expandable tape 21 in the radially outward direction of the workpiece 13. As a result, the workpiece 13 is divided along each division line 15 in such a manner that the division is started at the division start position formed along each division line 15. Thereafter, the chuck table 66 is lowered to the initial position. In lowering the chuck table 66, a vacuum produced by the vacuum source is applied to the holding surface 66a of the chuck table 66 to thereby hold the workpiece 13 through the expandable tape 21 on the chuck table 66 under suction, so that the variations in position of the workpiece 13 divided can be prevented.

A distance of upward movement of the chuck table 66 in expanding the expandable tape 21 is previously set such that an intended external force is applied to the whole of the workpiece 13 in the condition where the center of the holding surface 66a of the chuck table 66 coincides with the center of the workpiece 13. Accordingly, if the workpiece 13 held on the chuck table 66 is deviated in position, there is a possibility that an intended external force may not be applied to the workpiece 13 in expanding the expandable tape 21, causing incomplete division of the workpiece 13. For example, in the case that the attach position of the workpiece 13 to the expandable tape 21 is deviated, the workpiece 13 may be deviated in position with respect to the holding surface 66a of the chuck table 66 even though the annular frame 23 is set on the upper surface 54a of the support table 54 at a proper position. When the chuck table 66 is raised in this condition, there is a possibility that an error may be caused in the external force to be applied to the workpiece 13 and an area (undivided area) where the workpiece 13 is not properly divided may be left. This undivided area is prone to be left especially in the case that the number of division lines 15 in the workpiece 13 is large. To cope with this problem, the tape expanding unit 28 according to this preferred embodiment includes a position adjusting unit for detecting the position of the workpiece 13 and then adjusting the position of the frame unit 11 according to the position of the workpiece 13 detected above. By providing this position adjusting unit, the workpiece 13 can be set at a proper position on the chuck table 66, so that the workpiece 13 can be reliably divided by the expansion of the expandable tape 21.

As depicted in FIG. 3, the tape expanding unit 28 further includes a position adjusting unit 70 for adjusting the position of the workpiece 13 with respect to the holding surface 66a of the chuck table 66. More specifically, the position adjusting unit 70 includes a position detecting unit 72 for detecting the position of the workpiece 13 held on the holding surface 66a of the chuck table 66 and a plurality of position control units 74 for controlling the position of the frame unit 11 by the contact with the outer circumference of the annular frame 23. The position detecting unit 72 is located above the chuck table 66 and functions to detect the horizontal position of the workpiece 13 held by the chuck table 66. The position detecting unit 72 is configured by a camera unit or the like including a camera capable of imaging the workpiece 13. For example, the outer circumference of the workpiece 13 is imaged by the camera. The position detecting unit 72 is connected to a moving mechanism (not depicted). This moving mechanism functions to control the horizontal position and vertical position of the position detecting unit 72. In this preferred embodiment, the plural position control units 74 are four position control units 74 mounted under the support table 54.

Figure 4:
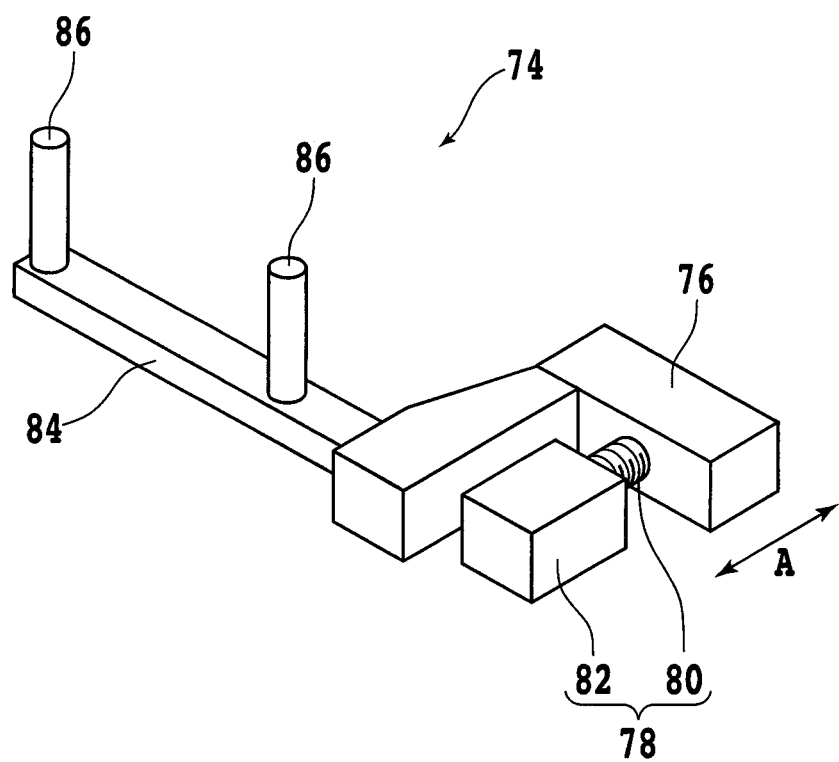
FIG. 4 is a perspective view depicting a position control unit included in the tape expanding unit depicted in FIG. 3.

As depicted in FIG. 4, there is depicted a perspective view of each position control unit 74. The position control unit 74 depicted in FIG. 4 includes a base 76 having an L-shape as viewed in plan and a ball-screw type moving mechanism 78 for controlling the position of the base 76. The moving mechanism 78 includes a ball screw 80 having one end threadedly engaged with the base 76 and a pulse motor 82 connected to the other end of the ball screw 80. When the ball screw 80 is rotated by the pulse motor 82, the base 76 is moved in the axial direction of the ball screw 80 (in the direction indicated by an arrow A in FIG. 4). A bar-shaped support portion 84 is fixed to the base 76. The support portion 84 extends in a direction perpendicular to the axial direction of the ball screw 80 in a horizontal plane. Two solid-cylindrical projections 86 (corresponding to an abutting unit) are provided on an upper surface of the support portion 84 so as to be spaced from each other in the longitudinal direction of the support portion 84. Each projection 86 is fixed to the support portion 84 so as to project upright from the upper surface of the support portion 84. The length of each projection 86 (the height of each projection 86 from the upper surface of the support portion 84) is larger than the thickness of the support table 54 (see FIG. 3). When the base 76 is moved in the direction A by the moving mechanism 78, the two projections 86 are simultaneously moved in the direction A in concert with the movement of the base 76. That is, by controlling the pulse motor 82 to thereby control the rotation of the ball screw 80, the two projections 86 can be moved to an arbitrary position in the direction A.

As depicted in FIG. 3, the support table 54 has four pairs of elongated holes 88a and 88b respectively along the four sides of the square support table 54. That is, two elongated holes 88a and 88b are formed along each side of the square support table 54. Each pair of elongated holes 88a and 88b are through holes extending from the upper surface 54a of the support table 54 to the lower surface 54b thereof. Each pair of elongated holes 88a and 88b are spaced from each other along each side of the support table 54, and the space between each pair of elongated holes 88a and 88b is substantially equal to the space between the two projections 86 of each position control unit 74. The length of each of the elongated holes 88a and 88b in the longitudinal direction thereof is larger than the diameter of each projection 86, and the width of each of the elongated holes 88a and 88b in the direction perpendicular to the longitudinal direction thereof is substantially equal to the diameter of each projection 86. Each position control unit 74 depicted in FIG. 4 is mounted on the lower surface 54b of the support table 54. When each position control unit 74 is mounted on the lower surface 54b of the support table 54, one of the two projections 86 in each position control unit 74 is inserted through the elongated hole 88a in each pair corresponding to each position control unit 74 and the other projection 86 is inserted through the elongated hole 88b in each pair. At this time, the upper end of each projection 86 projects upward from the upper surface 54a of the support table 54 as depicted in FIG. 3. In the tape expanding unit 28, the four pairs of elongated holes 88a and 88b are respectively formed along the four sides of the upper surface 54a of the square support table 54 so as to surround the central opening 54c of the support table 54. Further, the four position control units 74 (not depicted in FIG. 3) are arranged below the lower surface 54b of the support table 54 so as to respectively correspond to the four pairs of elongated holes 88a and 88b. That is, the two projections 86 of each position control unit 74 are inserted through the two elongated holes 88a and 88b in each pair. When the ball screw 80 is rotated by the pulse motor 82 in each position control unit 74 in the condition where the frame unit 11 is placed on the support table 54 and the chuck table 66, the two projections 86 in each position control unit 74 are moved in the longitudinal direction of the elongated holes 88a and 88b in each pair, so that the two projections 86 in each position control unit 74 come into contact with the outer circumference of the annular frame 23 to push the frame unit 11 in a horizontal plane from the four sides of the support table 54. Thus, the horizontal position of the frame unit 11 on the support table 54 and the chuck table 66 can be adjusted.

The position detecting unit 72 and each position control unit 74 are connected to a control unit (not depicted) for controlling the operation of these units 72 and 74. Information on the position of the workpiece 13 detected by the position detecting unit 72 is input into the control unit. According to the position of the workpiece 13 detected above, the control unit controls the operation of the moving mechanism 78 in each position control unit 74 such that the workpiece 13 is horizontally moved to a proper position on the holding surface 66a of the chuck table 66. As a result, the positions of the two projections 88 in each position control unit 74 are controlled by the moving mechanism 78 to thereby adjust the horizontal position of the workpiece 13 placed on the chuck table 66. For example, the moving mechanism 78 is controlled to move the two projections 86 in each position control unit 74 such that the center of the workpiece 13 comes into coincidence with the center of the holding surface 66a of the chuck table 66. In this manner, the position of the workpiece 13 is directly detected by the position detecting unit 72, and the position of the frame unit 11 is then adjusted according to the detected position of the workpiece 13 by each position control unit 74. Accordingly, even when the attach position of the workpiece 13 to the expandable tape 21 is deviated, the position of the workpiece 13 on the chuck table 66 can be accurately adjusted.

As depicted in FIG. 3, the fixing plate 56 provided above the support table 54 also has four pairs of elongated holes 90a and 90b respectively corresponding to the four pairs of elongated holes 88a and 88b of the support table 54. Each pair of elongated holes 90a and 90b are through holes extending from the upper surface 56a of the fixing plate 56 to the lower surface 56b thereof. Each of the elongated holes 90a and 90b is similar in size to each of the elongated holes 88a and 88b. When the fixing plate 56 comes near the support table 54, the upper ends of the two projections 86 in each position control unit 74 as projecting upward from the upper surface 54a of the support table 54 are respectively inserted into the two elongated holes 90a and 90b in each pair. Accordingly, in the condition where the annular frame 23 is interposed between the support table 54 and the fixing plate 56, the movement of each projection 86 is not hindered.

After adjusting the position of the frame unit 11 by moving each projection 86, the annular frame 23 is held between the support table 54 and the fixing plate 56, and the expandable tape 21 is expanded by operating the moving unit 60. Accordingly, an intended external force can be applied to the workpiece 13 to thereby reliably divide the workpiece 13.

While the position detecting unit 72 is provided above the chuck table 66 in this preferred embodiment as depicted in FIG. 3, the position detecting unit 72 may be provided above the second temporary setting area 22 depicted in FIG. 1. In this case, the position detecting unit 72 detects the position of the workpiece 13 placed in the second temporary setting area 22. The distance of transfer by the third transfer unit 26 in transferring the frame unit 11 from the second temporary setting area 22 to the chuck table 66 is previously set to a predetermined value. Accordingly, the position of the workpiece 13 placed on the chuck table 66 can be obtained by detecting the position of the workpiece 13 placed in the second temporary setting area 22 before transferring the workpiece 13 to the chuck table 66 and then calculating the position of the workpiece 13 according to the detected position of the workpiece 13 and the distance of transfer by the third transfer unit 26 after transferring the frame unit 11 to the chuck table 66. Thereafter, according to the position of the workpiece 13 calculated above, the position of the frame unit 11 can be adjusted by operating each position control unit 74.

As described above, the tape expanding unit 28 according to this preferred embodiment includes the position adjusting unit 70 for detecting the position of the workpiece 13 and then adjusting the position of the frame unit 11 according to the detected position of the workpiece 13. Accordingly, the workpiece 13 can be set at a proper position on the chuck table 66, so that the workpiece 13 can be reliably divided by the expansion of the expandable tape 21.

After expanding the expandable tape 21 by raising the chuck table 66, the chuck table 66 is lowered to the original position (initial position mentioned above). At this time, the annular area 21a (see FIG. 2B) of the expandable tape 21 is deformed to slack due to the expansion of the expandable tape 21. This slack may cause the contact of the device chips obtained by the division of the workpiece 13 in transferring the frame unit 11. Therefore, it is preferable to remove this slack. As depicted in FIG. 1, a heating unit 30 is provided above the tape expanding unit 28 to heat the expandable tape 21 expanded by the tape expanding unit 28 and thereby shrink the expandable tape 21. For example, the heating unit 30 is configured by a heater having a function of heating the expandable tape 21 attached to the workpiece 13. More specifically, as depicted in FIG. 1, the heating unit 30 includes a vertically extending rod 100, a circular flange portion 102 fixed to the lower end of the rod 100, and an annular heating element 104 fixed to the lower surface of the flange portion 102 along the outer circumference thereof.

The diameter of the flange portion 102 is substantially equal to the outer diameter of the annular gap defined between the chuck table 66 and the support table 54. Accordingly, the flange portion 102 is located directly above the chuck table 66 so as to be aligned with the chuck table 66. For example, the heating element 104 is configured to apply infrared light toward the expandable tape 21 and thereby heat the expandable tape 21. When the heating unit 30 is lowered to come near the frame unit 11 placed on the support table 54 and the chuck table 66, the annular heating element 104 is located in the vicinity of the annular area 21a (see FIG. 2B) of the expandable tape 21 as defined between the workpiece 13 and the annular frame 23. In this condition, the heating element 104 is operated to heat the expandable tape 21. As a result, the annular area 21a of the expandable tape 21 is mainly heated by the heating element 104, thereby causing the shrink. That is, the slack in the expandable tape 21 due to the expansion of the expandable tape 21 by the tape expanding unit 28 can be removed by the heating unit 30.

As depicted in FIG. 1, a cooling chamber 32 is provided behind the second temporary setting area 22, that is, on the rear side of the second temporary setting area 22 in the Y direction. Although not depicted, the tape expanding apparatus 2 includes another tape expanding unit in the cooling chamber 32, in which this tape expanding unit is similar to the tape expanding unit 28 depicted in FIG. 3. The tape expanding unit provided in the cooling chamber 32 is used for the division of the workpiece 13 in the case that a die attach film (DAF) is attached to the workpiece 13.

Figure 5:
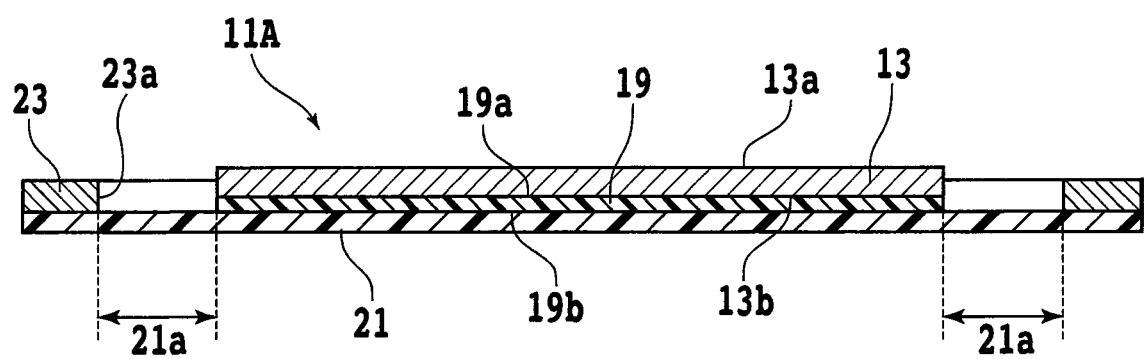
FIG. 5 is a sectional view depicting a frame unit including a die attach film.

FIG. 5 is a sectional view depicting a frame unit 11A similar to the frame unit 11 except that a die attach film (DAF) 19 is previously attached to the back side 13b of the workpiece 13. As depicted in FIG. 5, the DAF 19 attached to the back side 13b of the workpiece 13 is a circular film formed of resin or the like and having substantially the same diameter as that of the workpiece 13. The DAF 19 has a front side 19a and a back side 19b. The front side 19a of the DAF 19 is attached to the back side 13b of the workpiece 13, and the back side 19b of the DAF 19 is attached to the central portion of the expandable tape 21. The DAF 19 functions as an adhesive layer in bonding each device chip to a predetermined target, after dividing the workpiece 13 into a plurality of device chips. The frame unit 11A thus including the workpiece 13 with the DAF 19 is transferred from the second temporary setting area 22 to the tape expanding unit provided in the cooling chamber 32 by the third transfer unit 26. When the expandable tape 21 is expanded by the tape expanding unit in the cooling chamber 32, both the workpiece 13 and the DAF 19 are divided along the division lines 15 (see FIG. 2A) to thereby obtain the plurality of device chips each having a piece of the DAF 19.

In expanding the expandable tape 21 of the frame unit 11A including the DAF 19, the DAF 19 is preferably cooled to be hardened, so that the DAF 19 can be easily broken. The DAF 19 can be cooled by supplying a cold air to the cooling chamber 32 depicted in FIG. 1. A cold air supplying unit (not depicted) is connected to the cooling chamber 32 to supply a cold air such as a cooled dry air into the cooling chamber 32. For example, the cold air supplying unit includes a cold air source and a pipe for connecting the cold air source to the cooling chamber 32. For example, the cold air source is configured to use a dry air obtained by removing water from the air through a hollow fiber membrane (polymer separation membrane) formed of polymer material and to cool the dry air to a temperature of −20° C. to −10° C. by heat exchange or the like, thereby producing a cold air. This cold air is supplied through the pipe into the cooling chamber 32. In the condition where the frame unit 11A is held by the tape expanding unit provided in the cooling chamber 32, the cold air is introduced into a processing space defined in the cooling chamber 32 by the cold air supplying unit. Accordingly, the processing space in the cooling chamber 32 is cooled by the cold air to thereby harden the DAF 19 of the frame unit 11A, so that the DAF 19 can be easily broken in expanding the expandable tape 21. That is, in the condition where the DAF 19 is cooled as mentioned above, the expandable tape 21 is expanded by the tape expanding unit provided in the cooling chamber 32 to thereby divide the workpiece 13 and the DAF 19. In dividing the workpiece 13 with the DAF 19 attached thereto, the amount of expansion of the expandable tape 21 is relatively small, so that a slack in the expandable tape 21 is less prone to appear. Accordingly, the heating unit 30 may not be provided in the cooling chamber 32.

As depicted in FIG. 1, a cleaning unit 34 is provided in the first temporary setting area 12, that is, under the first guide rails 14a and 14b. The frame unit 11 having the workpiece 13 divided by the tape expanding unit 28 is transferred to the cleaning unit 34 by the second transfer unit 16, so as to clean the workpiece 13 divided. The cleaning unit 34 includes a circular spinner table 36 adapted to be rotated by a rotational drive mechanism (not depicted). The spinner table 36 has an upper surface as a holding surface for holding the workpiece 13 of the frame unit 11. The holding surface is a substantially horizontal surface. The holding surface is connected through a suction passage (not depicted) to a vacuum source (not depicted) such as an ejector, in which the suction passage is formed inside the spinner table 36. A plurality of clamps 38 for clamping the annular frame 23 of the frame unit 11 are provided on the outer circumference of the spinner table 36. When the frame unit 11 is transferred to the cleaning unit 34, the annular frame 23 is clamped by the plurality of clamps 38, and the workpiece 13 is held through the expandable tape 21 on the spinner table 36 under suction. The cleaning unit 34 further includes a nozzle (not depicted) for supplying a cleaning water and a dry air to the workpiece 13 held on the spinner table 36. In cleaning the workpiece 13 with the cleaning water, the spinner table 36 holding the workpiece 13 under suction is rotated at a predetermined speed and the cleaning water (e.g., pure water) is supplied from the nozzle toward the workpiece 13. Accordingly, any processing dust can be removed from the workpiece 13 by the cleaning water.

After completing the cleaning, the supply of the cleaning water from the nozzle is stopped. Thereafter, the dry air is supplied from the nozzle toward the workpiece 13 in the condition where the rotation of the spinner table 36 is maintained. Accordingly, the cleaning water left on the workpiece 13 can be blown away by the dry air, thus performing a drying process for the workpiece 13 cleaned. After completing the cleaning and drying as mentioned above, the frame unit 11 is placed on the first guide rails 14a and 14b by the second transfer unit 16.

As depicted in FIG. 1, a chamber 40 is provided behind the first temporary setting area 12, that is, on the rear side of the first temporary setting area 12 in the Y direction. A UV light applying unit (not depicted) for applying ultraviolet light to the frame unit 11 is provided in the chamber 40. The frame unit 11 transferred from the cleaning unit 34 to the first guide rails 14a and 14b by the second transfer unit 16 is next transferred to this UV light applying unit by the first transfer unit 10. The UV light applying unit includes a support table (not depicted) for supporting the frame unit 11 transferred by the first transfer unit 10 and a UV lamp (not depicted) for applying ultraviolet light to the expandable tape 21 of the frame unit 11 supported on the support table. The adhesive layer of the expandable tape 21 is formed of UV curable resin as mentioned above. Accordingly, when ultraviolet light is applied from the UV lamp to the expandable tape 21, the adhesive layer of the expandable tape 21 is cured. Accordingly, the adhesion of the adhesive layer of the expandable tape 21 is reduced, so that each device chip obtained by the division of the workpiece 13 can be easily separated from the expandable tape 21 in the subsequent step. Accordingly, it is possible to smoothly perform a bonding operation of bonding each device chip to a predetermined target after separating each device chip from the expandable tape 21. After completing the application of ultraviolet light by the UV light applying unit, the frame unit 11 is placed on the first guide rails 14a and 14b by the first transfer unit 10. Thereafter, the frame unit 11 is stored into the cassette 8 by the first transfer unit 10.

As described above, the tape expanding apparatus 2 according to this preferred embodiment includes the tape expanding unit 28 for expanding the expandable tape 21 attached to the workpiece 13. The tape expanding unit 28 includes the position adjusting unit 70 for detecting the position of the workpiece 13 and then adjusting the position of the frame unit 11 according to the position of the workpiece 13 detected above. Accordingly, the workpiece 13 can be set at a proper position on the chuck table 66, so that the workpiece 13 can be reliably divided by the expansion of the expandable tape 21.

The structure and method described above in this preferred embodiment are merely illustrative and may be suitably modified within the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A tape expanding apparatus for expanding an expandable tape of a frame unit in which a workpiece having a plurality of division start points formed along a plurality of division lines is supported through the expandable tape to an annular frame, the tape expanding apparatus comprising:
   a frame holding unit for holding the annular frame;
   a chuck table surrounded by the frame holding unit, the chuck table having a holding surface for holding the workpiece through the expandable tape;
   a moving unit for relatively moving the chuck table and the frame holding unit in a direction perpendicular to the holding surface;
   a cassette mounting stage for mounting the cassette storing the frame unit;
   a temporary setting area for temporarily setting the frame unit drawn from the cassette;

a transfer unit for transferring the frame unit from the temporary setting area to the chuck table; and a position adjusting unit for adjusting a position of the workpiece with respect to the holding surface;

the position adjusting unit including a position detector which detects the position of the workpiece temporarily set in the temporary setting area or held on the holding surface, and a position control unit having an abutting unit which abuts against an outer circumference of the annular frame supported by the frame holding unit and a moving mechanism which moves the abutting unit according to the position of the workpiece detected by the position detector, wherein the abutting unit imparts relative movement between the annular frame and the frame holding unit in a direction parallel to an upper surface of the frame holding unit, wherein the abutting unit comprises a plurality of projections extending through slots in the frame holding unit and traversable therein.

2. The tape expanding apparatus according to claim 1, wherein the position detector is a camera unit for imaging an outer circumference of the workpiece.

3. The tape expanding apparatus according to claim 1, further comprising:

a heating unit for heating an annular area of the expanding tape defined between the annular frame and the workpiece, thereby shrinking the annular area to thereby remove a slack in the annular area of the expandable tape due to the expansion of the expandable tape.

4. The tape expanding apparatus according to claim 1, further comprising:

a cooling chamber in which the frame holding unit and the chuck table are provided; and a cold air supplying unit for supplying a cold air into the cooling chamber, the expandable tape being attached through a die attach film to the workpiece.

5. The tape expanding apparatus according to claim 1, wherein the projections are pins.

6. The tape expanding apparatus according to claim 5, wherein the pins are cylindrical.

7. The tape expanding apparatus according to claim 1, wherein the position adjusting unit includes a plurality of position control units that move the abutting units along different directions.

8. A tape expanding apparatus for expanding an expandable tape of a frame unit in which a workpiece having a plurality of division start points formed along a plurality of division lines is supported through the expandable tape to an annular frame, the tape expanding apparatus comprising:

a frame holding unit for holding the annular frame;

a chuck table surrounded by the frame holding unit, the chuck table having a holding surface for holding the workpiece through the expandable tape;

a moving unit for relatively moving the chuck table and the frame holding unit in a direction perpendicular to the holding surface;

a cassette mounting stage for mounting the cassette storing the frame unit;

a temporary setting area for temporarily setting the frame unit drawn from the cassette;

a transfer unit for transferring the frame unit from the temporary setting area to the chuck table; and a position adjusting unit for adjusting a position of the workpiece with respect to the holding surface;

the position adjusting unit including a position detector which detects the position of the workpiece temporarily set in the temporary setting area or held on the holding surface, and a position control unit having an abutting unit which abuts against an outer circumference of the annular frame supported by the frame holding unit and a moving mechanism which moves the abutting unit according to the position of the workpiece detected by the position detector, wherein the abutting unit imparts relative movement between the annular frame and the frame holding unit in a direction parallel to an upper surface of the frame holding unit, wherein the frame holding unit comprises a fixing plate supported by a support table, wherein the annular fame is held therebetween.

9. The tape expanding apparatus according to claim 8, wherein the abutting unit comprises a plurality of projections located between a lower surface of the fixing plate and an upper surface of the support table.

10. The tape expanding apparatus according to claim 9, wherein each of the plurality of projections resides within slots located within at least one of the fixing plate and support table and traversable therein.

11. The tape expanding apparatus according to claim 10, wherein the plurality of projections are pins.

12. A tape expanding apparatus for expanding an expandable tape of a frame unit in which a workpiece having a plurality of division start points formed along a plurality of division lines is supported through the expandable tape to an annular frame, the tape expanding apparatus comprising:

a frame holding unit for holding the annular frame;

a chuck table surrounded by the frame holding unit, the chuck table having a holding surface for holding the workpiece through the expandable tape;

a moving unit for relatively moving the chuck table and the frame holding unit in a direction perpendicular to the holding surface;

a cassette mounting stage for mounting the cassette storing the frame unit;

a temporary setting area for temporarily setting the frame unit drawn from the cassette;

a transfer unit for transferring the frame unit from the temporary setting area to the chuck table; and a position adjusting unit for adjusting a position of the workpiece with respect to the holding surface;

the position adjusting unit including a position detector which detects the position of the workpiece temporarily set in the temporary setting area or held on the holding surface, and a position control unit having an abutting unit which abuts against an outer circumference of the annular frame supported by the frame holding unit and a moving mechanism which moves the abutting unit according to the position of the workpiece detected by the position detector, wherein the abutting unit imparts relative movement between the annular frame and the frame holding unit in a direction parallel to an upper surface of the frame holding unit, wherein the moving mechanism includes a ball screw and a pulse motor connected to the ball screw.

* * * * *